(12) United States Patent
Nishizawa

(10) Patent No.: US 8,158,507 B2
(45) Date of Patent: Apr. 17, 2012

(54) METHOD FOR MANUFACTURING SEMICONDUCTOR DEVICE

(75) Inventor: Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 109 days.

(21) Appl. No.: 12/871,971

(22) Filed: Aug. 31, 2010

(65) Prior Publication Data

US 2011/0195567 A1    Aug. 11, 2011

(30) Foreign Application Priority Data

Feb. 8, 2010    (JP) .................. 2010-025464

(51) Int. Cl.
*H01L 21/44*    (2006.01)
(52) U.S. Cl. .................. 438/613; 438/678; 438/675
(58) Field of Classification Search .................. 438/613, 438/675, 678
See application file for complete search history.

(56) References Cited

U.S. PATENT DOCUMENTS 5,126,921 A  *  6/1992  Fujishima et al. ............ 361/525

FOREIGN PATENT DOCUMENTS

| GB | 2 285 174 A | 6/1995 |
|---|---|---|
| JP | 2-152228 A | 6/1990 |
| JP | 7-193214 A | 7/1995 |
| JP | 2000-31095 A | 1/2000 |

OTHER PUBLICATIONS

T. S. Kuan et al., Reactions of Pd on (100) and (110) GaAs surfaces, J. Appl. Phys. 58(4):1519-1522 (1995).

* cited by examiner

*Primary Examiner* — Luan C Thai
(74) *Attorney, Agent, or Firm* — Leydig, Voit & Mayer, Ltd.

(57) ABSTRACT

A method for manufacturing a semiconductor device comprises: immersing a semiconductor substrates in a Pd activating solution containing Pd ions and adhering a Pd catalyst to a surface of the semiconductor substrate; and immersing the semiconductor substrate, to which the Pd catalyst is adhered, in a Pd electroless plating solution and forming an electroless-plated Pd film on the semiconductor substrate.

8 Claims, 9 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device that can form the metal film having high coating characteristics and adhesion on the semiconductor substrate at low costs.

2. Background Art

When electrodes other than an ohmic electrode are formed on a semiconductor substrate, generally, two layers or more metal films are often formed using vapor deposition, sputtering or the like. For the upper layer, a material having high electric conductivity, whose surface is hard to be oxidized, such as Au, is used. In place of Au, Ag, Cu or the like may be used. The lower layer is a barrier layer that prevents the diffusion of Au into the semiconductor substrate. As the barrier layer, Ti, TiN, TaN, Pt or the like is often used. Furthermore, in order to secure required current, these layers may be subjected to Au electrolytic plating as power supply layers. In place of Au electrolytic plating, Ag or Cu having high conductivities may also be used.

As the characteristics of the electrode, in addition to electrical characteristics, such as low electric resistance and electro-migration suppression, a sufficient adhesion is required for preventing peel-off during die bonding or wire bonding. Therefore, as the metal for the electrode contacting the surface of the semiconductor, a metal having a high adhesion to the semiconductor is used. For example, Ti or Pt is used for GaAs.

In addition, when a penetrating electrode that electrically connects the top surface side to the back surface side of the substrate is formed in the via hole that penetrates through the semiconductor substrate, the inner wall of the via hole must be sufficiently coated with a metal film. When the metal film is formed using vapor deposition or sputtering, the metal film on the sidewall of the via hole becomes thinner than the metal film on other portions. Therefore, the efficiency of forming the metal film on the sidewall of the via hole is elevated using inverse sputtering or planetary vapor deposition.

SUMMARY OF THE INVENTION

However, by conventional methods using vapor deposition or sputtering, the thickness of the metal film on the sidewall of the via hole was several percent the thickness on flat portions. Therefore, the lowering of yield due to poor conduction caused problems. Also in the case of performing Au electrolytic plating using the metal film formed by vapor deposition or sputtering as the power supply layer, the Au-plated film was not grown or abnormally grown in the via hole causing poor conduction or poor appearance, and also causing lower yield.

In view of the above-described problems, an object of the present invention is to provide a method for manufacturing a semiconductor device that can form the metal film having high coating characteristics and adhesion on the semiconductor substrate at low costs.

According to the present invention, a method for manufacturing a semiconductor device comprises: immersing a semiconductor substrates in a Pd activating solution containing Pd ions so as to adhere a Pd catalyst on a surface of the semiconductor substrate; and immersing the semiconductor substrate, on which the Pd catalyst is adhered, in a Pd electroless plating solution so as to form an electroless-plated Pd film on the semiconductor substrate.

The present invention makes it possible to form the metal film having high coating characteristics and adhesion on the semiconductor substrate at low costs.

Other and further objects, features and advantages of the invention will appear more fully from the following description.

DETAILED DESCRIPTION OF THE PREFERRED EMBODIMENTS

Figure 1:
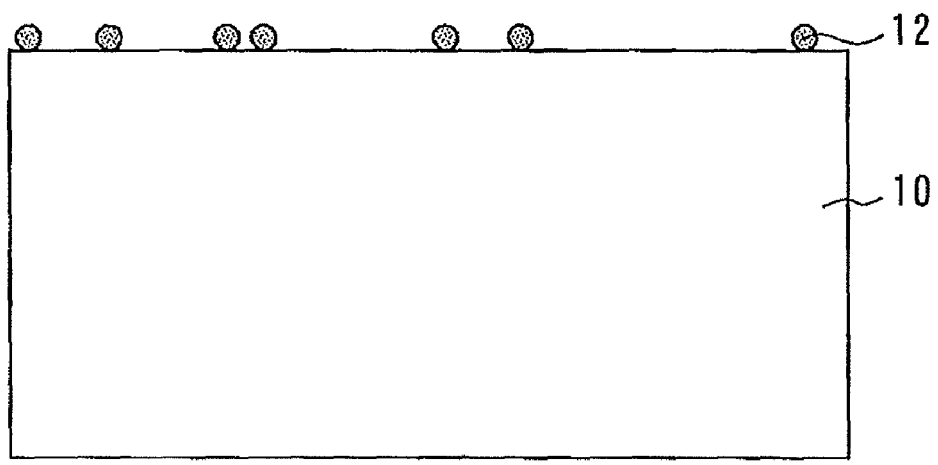
FIGS. 1 to 3 are sectional views for showing that a Pd-plated film is formed on the material to be plated other than group-VIII metals.

Heretofore, electroless plating of Pd onto a smooth surface, such as the surface of a semiconductor substrate, was considered to be difficult. Theoretically, an electroless-plated Pd film can be formed on a group-VIII metal, such as Pd and Ni, having a function to oxidize a reductant on the surface to be plated. On the other hand, when a Pd-plated film is formed on the material to be plated other than group-VIII metals, as shown in FIG. 1, after forming a thin film of the Pd catalyst 12 on the surface of the material to be plated 10, plating is performed.

Figure 2:
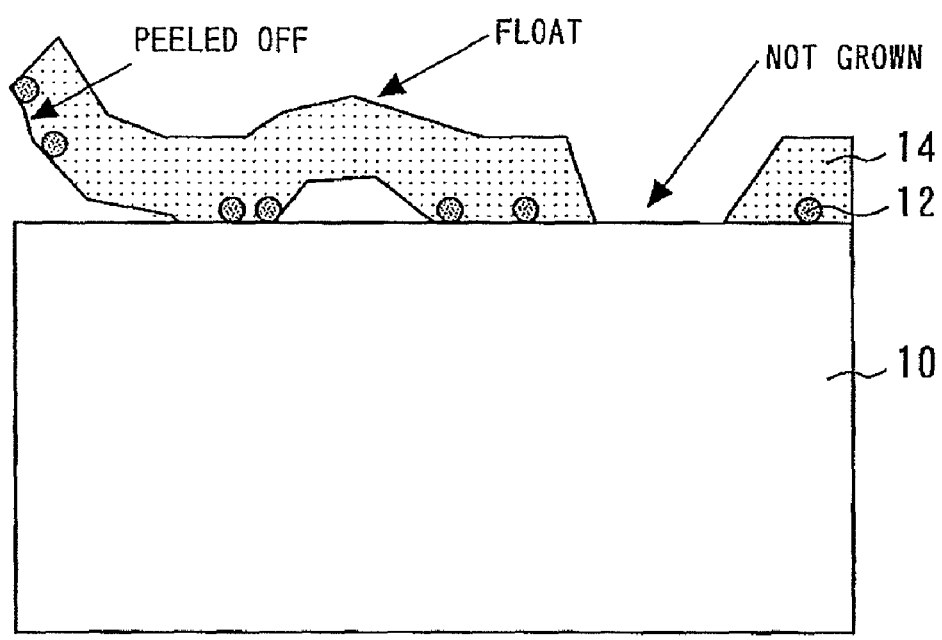
Figure 3:
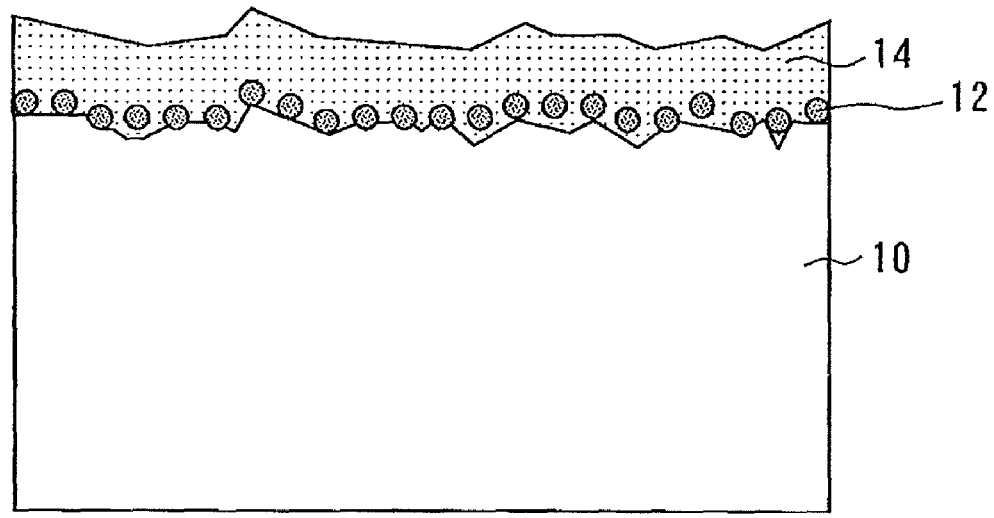

However, since the Pd catalyst 12 is merely adhered onto the surface, adhesion is poor. Therefore, as shown in FIG. 2, the Pd-plated film 14 cannot be grown, may float, or easily peeled off. In general, in order to compensate the weakness of adhesion, as shown in FIG. 3, the surface to be plated is roughened by blasting or the like to hold the Pd catalyst 12 by the anchoring effect. However, since the surface of the semiconductor substrate was basically made to be a mirror surface having a surface roughness of Ra=1 nm or the like by a polishing process, the Pd catalyst was considered not to be adhered.

This time, the present inventors found that an electroless-plated Pd film could be formed on a semiconductor substrate. The present inventors consider that the reason why the electroless-plated Pd film can be formed is because the Pd catalyst reacts with the semiconductor substrate. This will be described using a GaAs substrate as an example. It has been known that GaAs reacts with Pd to produce a $PdGa_{-0.3}As_{-0.2}$ ternary eutectic at 20° C. to 250° C. (For example, refer to T. S. Kuan, J. Appl. Phys., 58 (4), 1985). Specifically, by a Pd activating process (normally performed at 20° C. to 30° C.), after the Pd catalyst is adhered on the surface of the GaAs substrate, the $PdGa_{-0.3}As_{-0.2}$ ternary eutectic is formed by the reaction with GaAs. Therefore, a favorable Pd layer can be formed even on a smooth surface. Thus, the Pd-plated film can be stably formed by a Pd electroless plating process in the subsequent step. Favorable adhering performance can also obtained from the time of film forming.

On the basis of these findings, the present inventors devised the present invention. The embodiments of the present invention will be described below referring to the drawings. The identical or corresponding constitutes will be denoted by the same numerals, and the repetition of the description thereof will be omitted.

FIRST EMBODIMENT

A method for manufacturing a semiconductor device according to the first embodiment of the present invention will be described. FIGS. 4 to 12 are sectional views for illustrating the method for manufacturing a semiconductor device according to the first embodiment.

Figure 4:
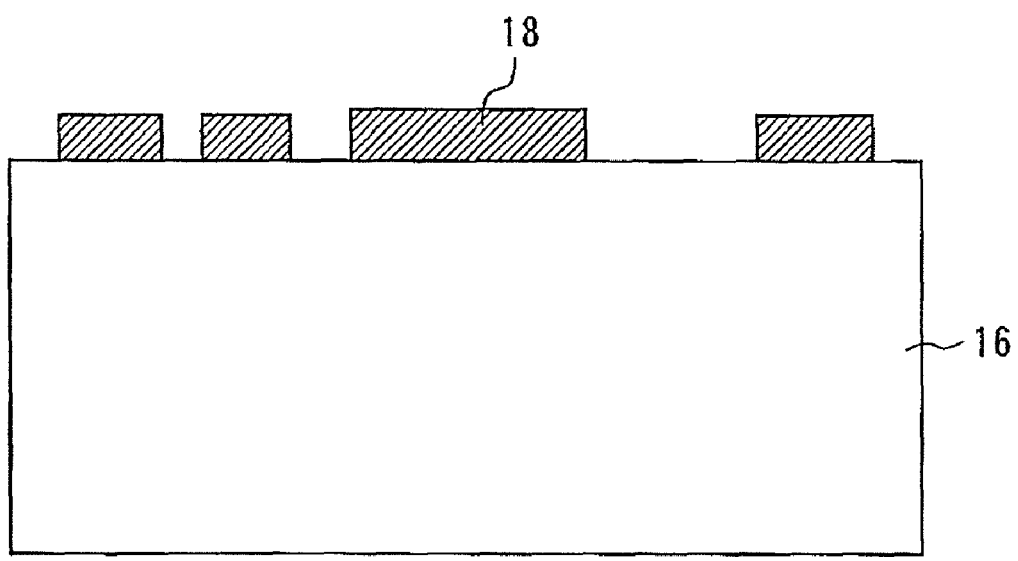
FIGS. 4 to 12 are sectional views for illustrating the method for manufacturing a semiconductor device according to the first embodiment.
Figure 5:
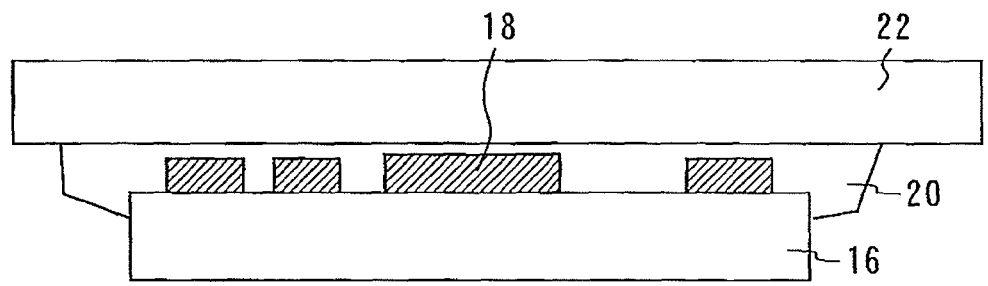

First, as shown in FIG. 4, devices, such as an electrode 18 and a transistor (not shown) are formed on the upper surface of a GaAs substrate 16 (semiconductor substrate). Then, as shown in FIG. 5, the device forming surface (upper surface) of the GaAs substrate 16 is adhered to a sapphire support substrate 22 having a thickness of about 1 mm by an adhesive 20, such as wax and an adhesive tape. In such a state, the back surface of the GaAs substrate 16 is polished to thin the GaAs substrate 16.

Figure 6:
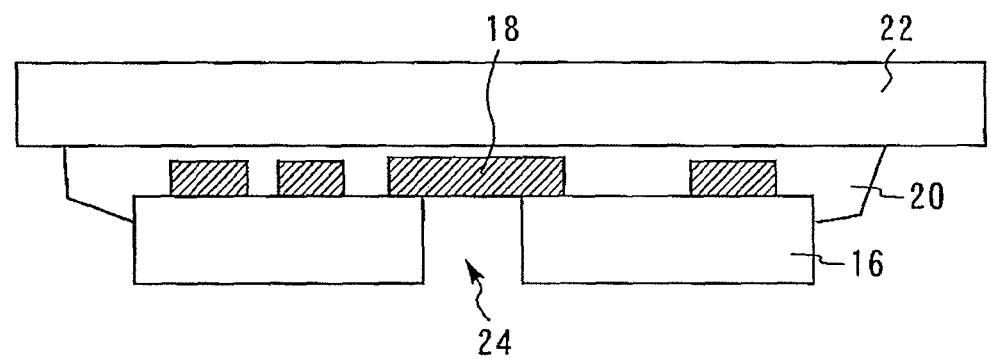

Next, as shown in FIG. 6, the GaAs substrate 16 is etched from the back surface side. Thereby, a via hole 24 is formed through the GaAs substrate 16 from the back surface of the GaAs substrate 16 to the back surface of the electrode 18.

Figure 7:
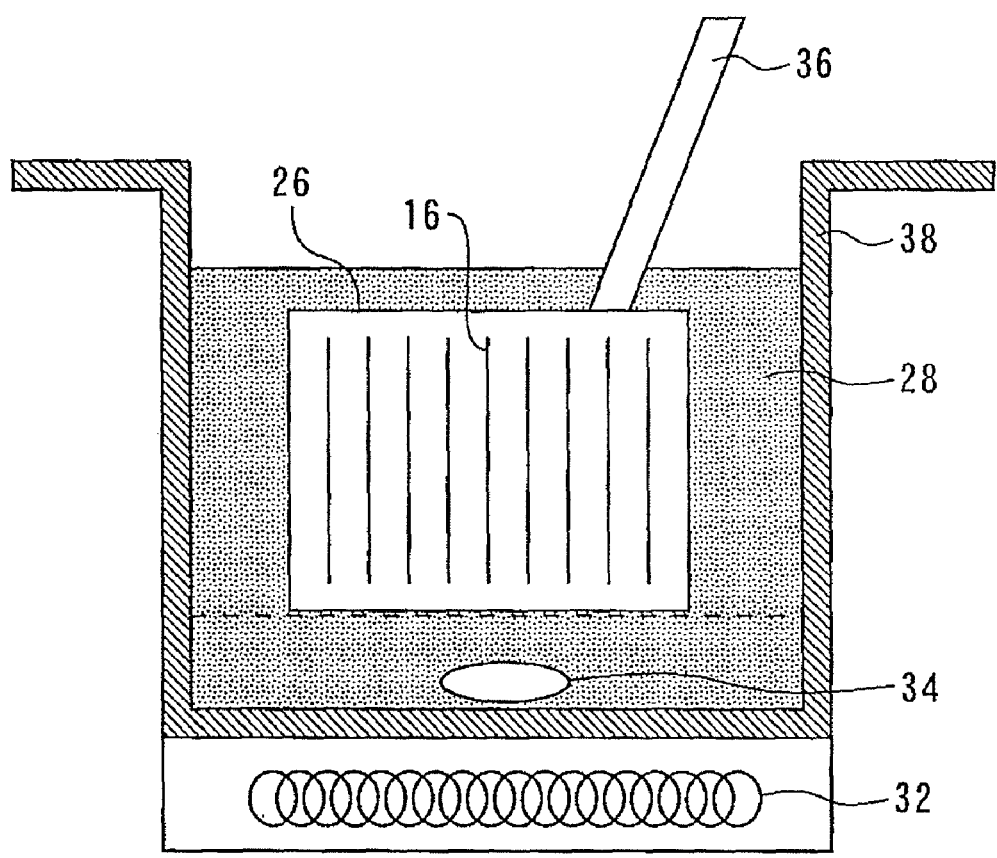
Figure 8:
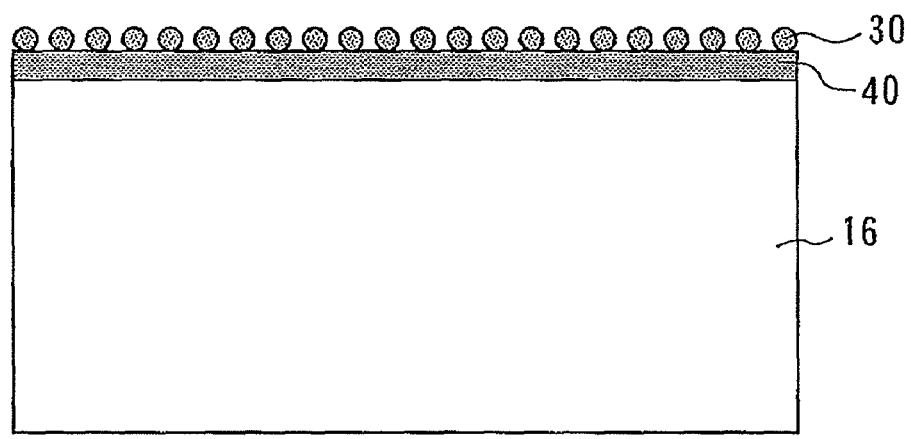

Next, as shown in FIG. 7, a plurality of GaAs substrates 16 in the state of wafers are held in a cassette 26 so as not to contact with one another. In this state, the GaAs substrates 16 are immersed in a Pd activating solution 28 containing Pd ions (Pd activating process). The immersing time is 1 to 5 minutes. Thereby, as shown in FIG. 8, which is an enlarged diagram, a Pd catalyst 30 having a thickness of several nanometers is adhered on the surface of each GaAs substrate 16. By elevating the temperature of the Pd electroless plating solution to 20° C. or higher, the Pd catalyst 30 reacts with the GaAs substrates 16 to form a Pd—Ga—As mixed layer 40.

Here, the Pd activating solution 28 is, for example, a palladium chloride ($PdCl_2$) solution. The Pd content of the Pd activating solution 28 is about 0.1 to 1.0 g/L. The Pd activating solution 28 is warmed to a liquid temperature of about 20 to 30° C. by a heater 32, and stirred by a stirrer 34. However, the adhering quantity or the uniformity of the Pd catalyst 30 differs depending on the Pd content and/or liquid temperature, causing the abnormality of interfacial adhesion, surface morphology, and film floating. Therefore, the Pd content and liquid temperature must be adjusted within proper ranges.

When the surface wettability of the GaAs substrate 16 is poor, the pretreatment such as oxygen ashing and ozone ashing is carried out before performing the Pd activating process. Furthermore, surfaces may be cleaned with an acid or alkali solution having the effect of removing the surface oxide film to enhancing the adhesion of the solder film and the semiconductor.

In addition, to inhibit film formation on the device itself, the cassette 26, the stirrer 34, and the handle 36 are made of Teflon® (Du Pont™, USA). The beaker 38 is composed of Pyrex Glass® (quartz), which has a high heat resistance and is hard to form a film on itself.

Figure 9:
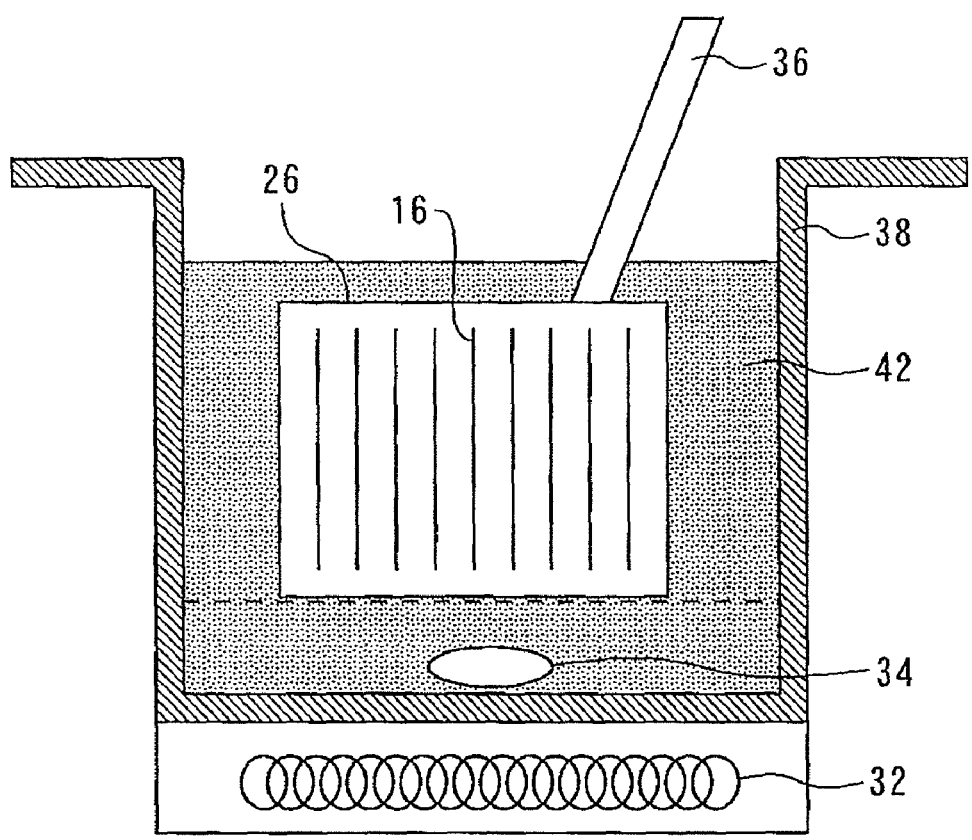
Figure 10:
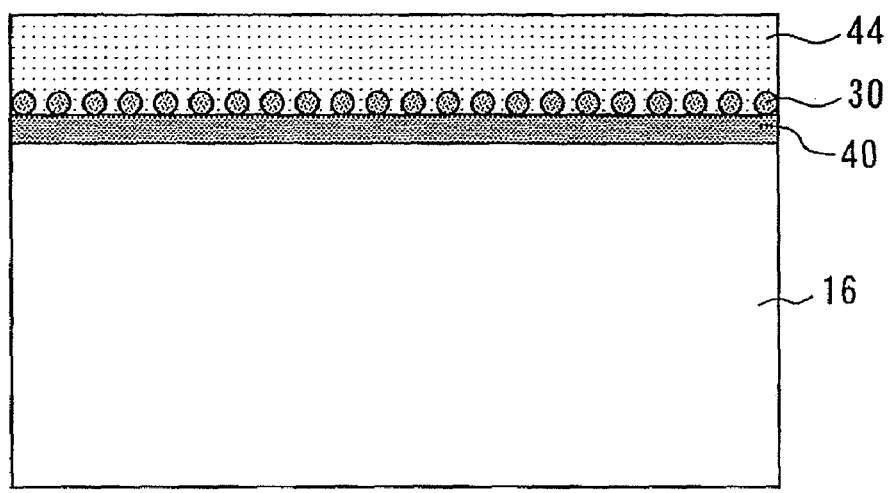
Figure 11:
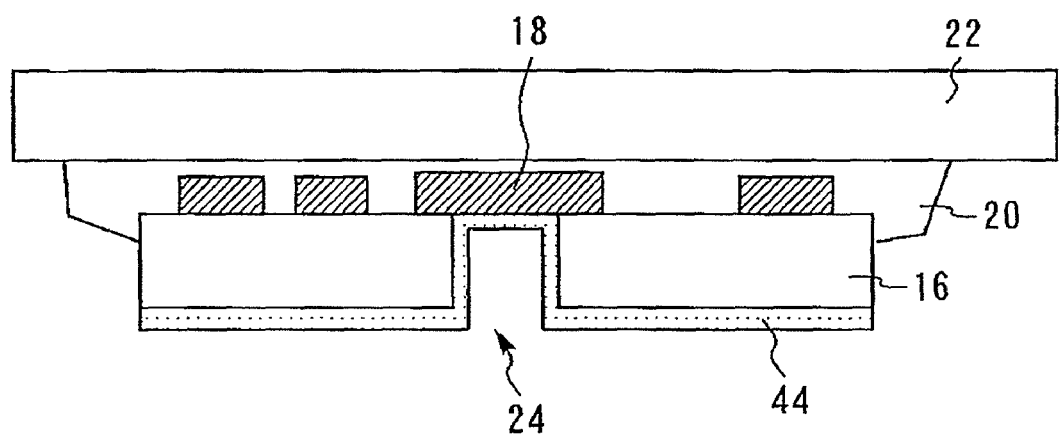
Figure 12:
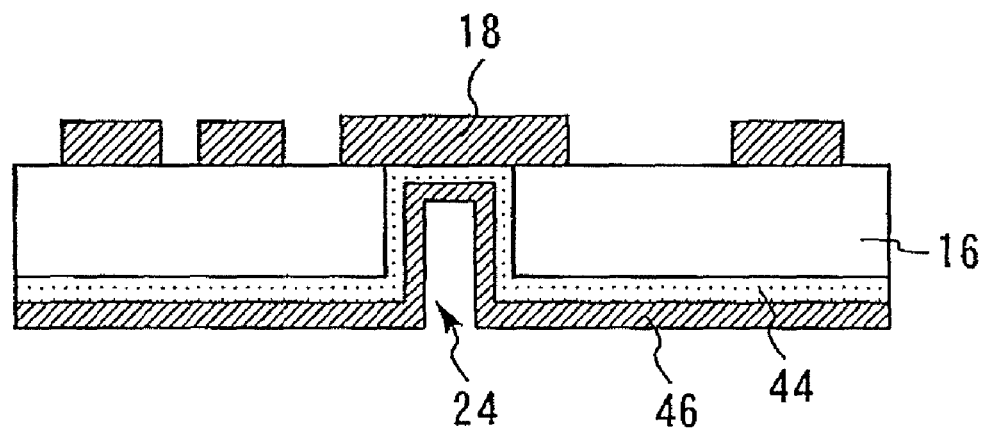

Next, as shown in FIG. 9, the GaAs substrate 16 on which a Pd catalyst 30 is adhered is immersed in a Pd electroless plating solution 42. Thereby, as shown in FIG. 10 (enlarged diagram) and FIG. 11, a Pd-plated film 44 is formed on the GaAs substrate 16. Then, as shown in FIG. 12, an Au layer 46 is formed using Au electrolytic plating. Thereafter, annealing if performed, and the GaAs substrate 16 is peeled from the sapphire support substrate 22.

Here, the Pd electroless plating solution 42 is a solution containing hypophosphorous acid, which is a reducing agent; an inorganic acid salt, such as a chloride; ethylenediamine, which is an additive; and a palladium compound. Thereby, hypophosphite ions are oxidized using the adhered Pd catalyst 30 as the catalyst, the Pd ions are reduced by the electrons released at this time, and the Pd-plated films 44 are formed. Specifically, the Pd-plated films 44 are formed on the back surface of the GaAs substrate 16, the sides of the via hole 24, and the back surface of the electrode 18.

The Pd content of the Pd electroless plating solution 42 is about 0.1 to 10 g/L. The Pd electroless plating solution 42 is heated by the heater 32, and is used at a liquid temperature of about 50° C. To stably perform plating, the bath volume of the Pd activating solution 28 and the Pd electroless plating solution 42 is preferably at least 1 L for 1.0 $dm^2$ of the plating area.

By performing annealing at 20° C. or above, Pd reacts with the GaAs substrate 16, and a Pd—Ga—As mixed layer is formed. Specifically, when the annealing temperature is 20° C. to 250° C., a Pd—Ga—As ternary eutectic is formed. When the annealing temperature is 250° C. to 350° C., a mixed crystal of $PdAs_2$ and $Pd_2Ga$ is formed. When the annealing temperature is 350° C. to 500° C., a mixed crystal of $PdAs_2$, $Pd_2Ga$, and PdGa is formed. Thus, the crystalline state is varied depending on the annealing temperature.

Figure 13:
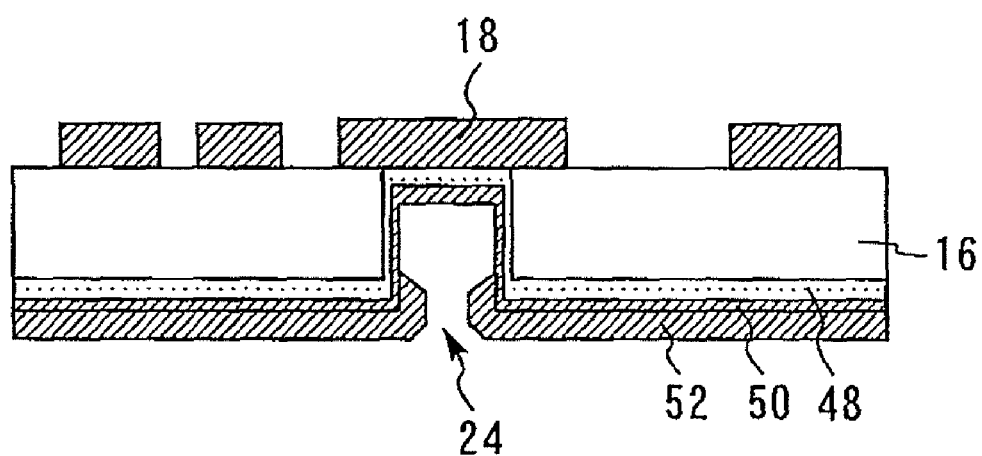
FIG. 13 is a sectional view for illustrating the method for manufacturing a semiconductor device according to the comparative embodiment.

The effect of the present embodiment will be described comparing with a comparative embodiment. FIG. 13 is a sectional view for illustrating the method for manufacturing a semiconductor device according to the comparative embodiment. In the comparative embodiment, a Ti layer 48 and an Au layer 50 are sequentially formed on the surface of a GaAs substrate 16 by vapor deposition or sputtering, and an Au layer 52 is formed thereon by electrolytic plating.

However, since the Ti layer 48 and the Au layer 50 on the sidewall of the via hole 24 are thinned, defective conduction occurs. Furthermore, when electrolytic plating is performed using the Ti layer 48 and the Au layer 50 as power supply layers, the Au layer 52 is not grown or abnormally grown in the via hole 24.

In the present embodiment, on the other hand, the Pd-plated film 44 is formed on the GaAs substrate 16 after the Pd catalyst 30 has been adhered on the surface of the GaAs substrate 16 by the Pd activating process. Thereby, the metal film can be more uniformly formed on the sidewall of the via hole 24 comparing with sputtering or vapor deposition in conventional methods, and electrical conduction can be easily secured. In addition, when the electrolytic-plating of Au is performed, since the inner wall of the via hole is sufficiently coated with the Pd film, the abnormality such as non-growing of the electrolytic-plated Au layer is hard to occur. Therefore, the metal film having high coating characteristics and adhesion can be formed on the semiconductor substrate at low costs.

Figure 14:
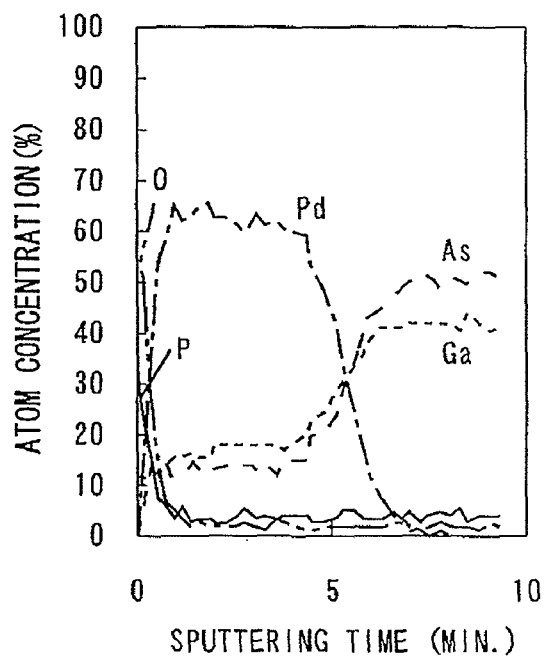
FIG. 14 is a diagram showing the result of depth Auger analysis carried out for the electroless-plated Pd film on the GaAs substrate.

FIG. 14 is a diagram showing the result of depth Auger analysis carried out for the electroless-plated Pd film on the GaAs substrate. At this time, the sample was annealed at 250° C. for 4 hours in a nitrogen atmosphere. As a result of the analysis, the same degrees of Pd, Ga, and As were mixed in the depth direction. A tape test for adhesive characteristics (JIS Standard H-8514) was carried out, and the favorable adhesive characteristics of "no peel-off" were confirmed. It is considered that the adhesive characteristics were improved by the formation of the mixed layer.

Figure 15:
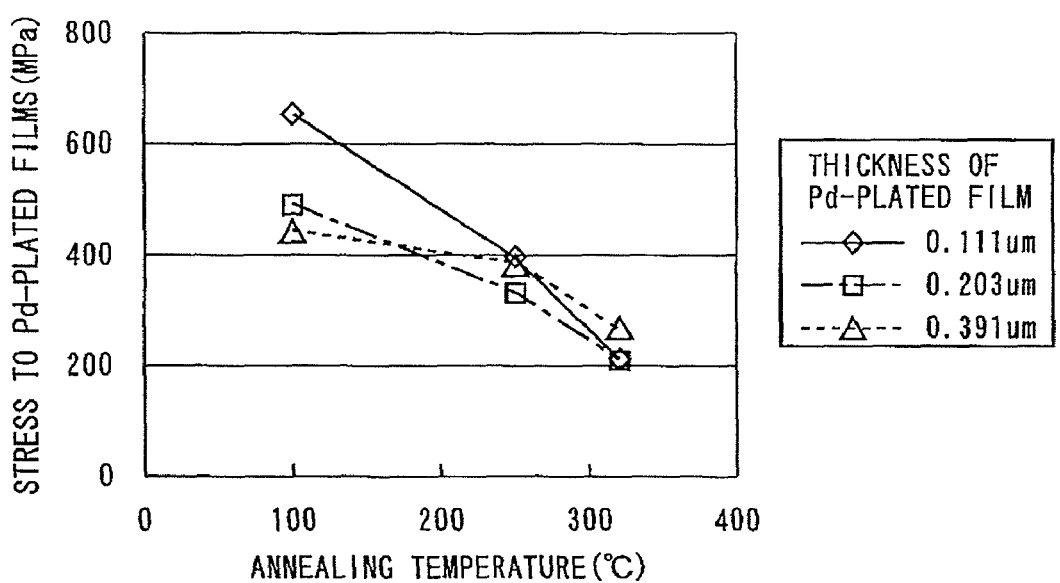
FIG. 15 is a graph showing the stress to Pd-plated films by annealing temperatures.

FIG. 15 is a graph showing the stress to Pd-plated films by annealing temperatures. The stress was lowered as the annealing temperature was elevated, and the stress was reduced to approximately half after annealing of 320° C./1 hr comparing with after annealing of 100° C./10 min. When stress is elevated, the wafer or chip is warped, and heat resistance characteristics or the like are deteriorated.

When the annealing temperature is determined, for example, the annealing temperature is preferably 350° C. or lower, because if the GaAs semiconductor device is heated to 350° C. or higher, the characteristics of the ohmic electrode and the active region are varied. On the other hand, when resin die bonding is carried out at 250° C., it is preferable to previously perform annealing so as not to cause the variation of stress characteristics during die bonding. In this case, annealing is preferably performed at about 250° C. to 350° C. If die bonding is performed using an AuSn solder (20% Sn), there is a thermal history of about 300° C. or higher. In this case, annealing is preferably performed at about 300° C. to 350° C.

Since Pd is not grown on the resist of an organic material or the like, an optional shape of the Pd film can be formed when electroless plating of Pd is carried out after the resist pattern has been formed on the semiconductor substrate. After forming the plated film, the resist is removed by organic cleaning.

Depending on the use of the electrode, other electroless-plated films, such as Ni, Cu, and Au films, may be formed on the electroless-plated Pd film. When all the patterns are connected, electrolytic plated films, such as Au, Ag, and Cu films, may be continuously formed.

SECOND EMBODIMENT

Figure 16:
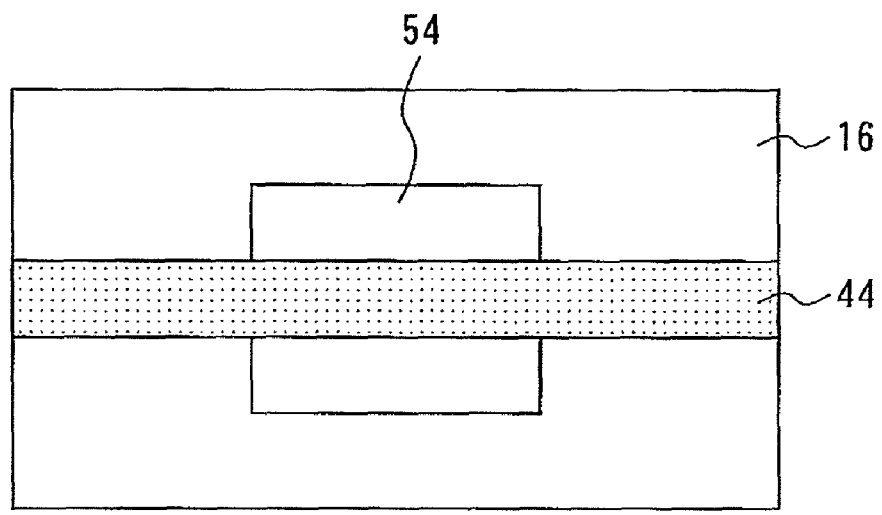
FIG. 16 is a top view for illustrating the method for manufacturing the semiconductor device according to the second embodiment.
Figure 17:
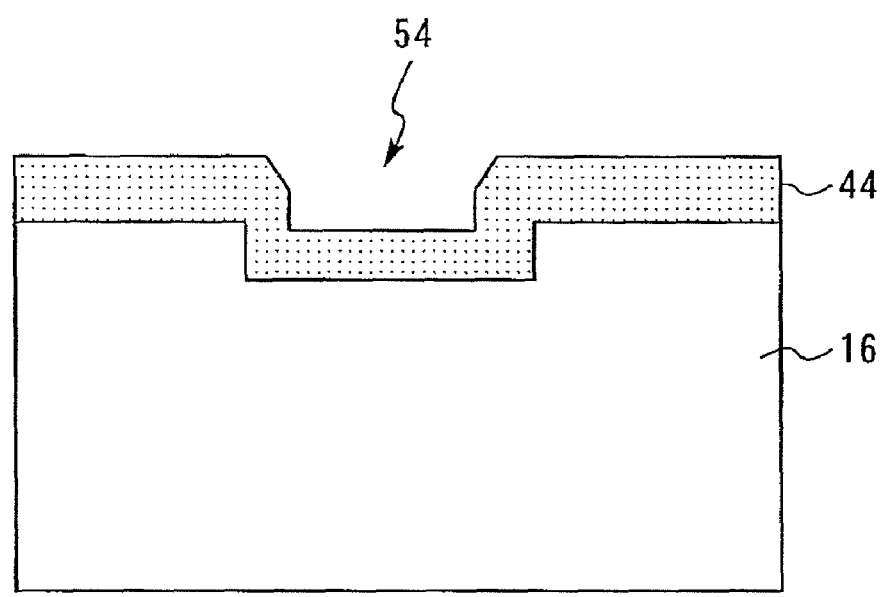
FIG. 17 is a sectional view for illustrating the method for manufacturing the semiconductor device according to the second embodiment.

A method for manufacturing a semiconductor device according to the second embodiment will be described referring to the drawings. FIG. 16 is a top view for illustrating the method for manufacturing the semiconductor device according to the second embodiment; and FIG. 17 is a sectional view thereof.

First, a bump 54 is formed on a GaAs substrate 16 (semiconductor substrate) by etching. Next, in the same manner as in the first embodiment, a Pd-plated film 44 is formed on the flat portion and the side portion of the bump 54 on the GaAs substrate 16. Thus, a Pd film can be uniformly formed on the surface of the semiconductor substrate having the dump. For example, wirings or electrode pads across the bump can be formed without disconnecting or narrowing.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-025464, filed on Feb. 8, 2010 including specification, claims, drawings and summary, on which the Convention priority of the present application is based, are incorporated herein by reference in its entirety.

What is claimed is:

1. A method for manufacturing a semiconductor device comprising:
    immersing a semiconductor substrate in a Pd activating solution containing Pd ions thereby adhering a Pd catalyst to a surface of the semiconductor substrate; and
    immersing the semiconductor substrate, to which the Pd catalyst is adhered, in a Pd electroless plating solution and forming an electroless-plated Pd film on the semiconductor substrate.

2. The method for manufacturing a semiconductor device according to claim 1, wherein the semiconductor substrate is GaAs.

3. The method for manufacturing a semiconductor device according to claim 1, wherein the Pd activating solution is a palladium chloride solution.

4. The method for manufacturing a semiconductor device according to claim 1, wherein, in forming the electroless-plated Pd film, maintaining the temperature of the Pd electroless plating solution at 20° C. or higher.

5. The method for manufacturing a semiconductor device according to claim 1, further comprising annealing the electroless-plated Pd film at a temperature in a range from 250° C. to 350° C.

6. The method for manufacturing a semiconductor device according to claim 5, including annealing at a temperature in a range from 300° C. to 350° C.

7. The method for manufacturing a semiconductor device according to claim 1, further comprising:
    forming an electrode on an upper surface of the semiconductor substrate;
    forming a via hole through the semiconductor substrate from a back surface of the semiconductor substrate to a back surface of the electrode; and
    forming the electroless-plated Pd film on the back surface of the semiconductor substrate, a side surface of the via hole, and the back surface of the electrode.

8. The method for manufacturing a semiconductor device according to claim 1, further comprising:
    forming a bump having a flat portion and a side portion on the semiconductor substrate; and
    forming the electroless-plated Pd film on the flat portion and the side portion of the bump.

* * * * *